United States Patent
Matsuoka

(10) Patent No.: US 7,097,527 B2
(45) Date of Patent: Aug. 29, 2006

(54) METHOD OF MANUFACTURING ELECTROLUMINESCENCE PANEL

(75) Inventor: Hideki Matsuoka, Gifu (JP)

(73) Assignee: Sanyo Electric Co., Ltd., (JP)

( * ) Notice: Subject to any disclaimer, the term of this patent is extended or adjusted under 35 U.S.C. 154(b) by 0 days.

(21) Appl. No.: 10/256,306

(22) Filed: Sep. 27, 2002

(65) Prior Publication Data

US 2003/0067268 A1    Apr. 10, 2003

(30) Foreign Application Priority Data

Sep. 28, 2001   (JP) .............................. 2001-303819

(51) Int. Cl.
*H05B 33/10* (2006.01)
*H01L 51/56* (2006.01)
*H01J 9/40* (2006.01)

(52) U.S. Cl. .......................................... 445/25; 445/24

(58) Field of Classification Search ................ 313/504, 313/512; 445/24, 25
See application file for complete search history.

(56) References Cited

U.S. PATENT DOCUMENTS

| | | | |
|---|---|---|---|
| 4,357,557 A | 11/1982 | Inohara et al. | |
| 4,446,399 A | 5/1984 | Endo et al. | |
| 6,210,815 B1 | 4/2001 | Ooishi | 428/690 |
| 6,624,570 B1 * | 9/2003 | Nishio et al. | 313/512 |
| 6,628,353 B1 | 9/2003 | Nakamura | 349/95 |
| 2003/0017777 A1 * | 1/2003 | Matsuoka et al. | 445/24 |
| 2003/0218422 A1 * | 11/2003 | Park et al. | 313/512 |

FOREIGN PATENT DOCUMENTS

| | | |
|---|---|---|
| JP | 2000-206894 | 7/2000 |
| JP | 2001-203076 | 7/2001 |
| KR | 2001-0051478 | 6/2001 |

OTHER PUBLICATIONS

Office Action for Chinese Application No. 02143265.1 filed Sep. 25, 2002.
Notice to Submit Argument for Korean Application No. 10-2002-0058743 dated Nov. 11, 2004.
Copy of the Decision of Rejection of Taiwanese Patent Application No. 091121442 with English Translation Excerpt.
Copy of Taiwanese Publication No. 393819.

* cited by examiner

Primary Examiner—Mariceli Santiago
(74) Attorney, Agent, or Firm—Cantor Colburn LLP

(57) ABSTRACT

An opposing substrate which is subjected to desiccant application, baking, UV cleaning, UV sealant application, or the like and an element substrate having EL elements formed thereon are affixed together by applying a sealing liquid such as silicon oil in a vacuum. Subsequently, when exposed to a normal atmosphere, the opposing substrate and the element substrate are adsorbed to each other while a predetermined gap is maintained in between. In this state, the UV sealant is cured with UV irradiation. It is thus possible to enclose the sealing liquid between the opposing substrate and the element substrate using a simple manufacturing method.

9 Claims, 7 Drawing Sheets

METHOD OF MANUFACTURING ELECTROLUMINESCENCE PANEL

BACKGROUND OF THE INVENTION

1. Field of the Invention

The present invention relates to a method of manufacturing an organic EL panel, in which an EL (electroluminescence) element substrate having a plurality of EL elements formed thereon and an opposing substrate facing the EL element substrate are laminated together to form an organic EL panel.

2. Description of Related Art

Conventionally, organic EL (ElectroLuminescence) panels, one type of flat display device, have attracted attention as self-emissive display panels. An organic EL panel is produced by first forming a large number of EL elements on a glass substrate (an element substrate) by evaporation of various materials and then laminating an opposing substrate (cap glass, sealing substrate) onto an element forming surface of the element substrate. In such an organic EL panel, moisture must be excluded because the organic EL elements will significantly deteriorate if exposed to moisture. Further, in order to protect the organic EL elements from external damage, after formation of the EL elements, the opposing substrate is laminated onto the element substrate such that the EL elements are covered with the opposing substrate.

A method of manufacturing an organic EL panel according to the related art will be described with reference to FIGS. 1, 2A to 2D, 3A and 3B. First, an opposing substrate (cap glass) is prepared and a desiccant is applied to the opposing substrate (S1). More specifically, as shown in FIG. 2A, a desiccant 42 is applied to an etching pocket 64 formed on a panel region of the glass substrate 60 by etching. Then, the whole system is baked in an oven (S2). As a consequence, a solvent or the like evaporates from the desiccant 42 and the desiccant 42 is activated. Then, after cleaning a surface of the substrate 60 by UV irradiation (S3), a UV sealant is applied on the surface to form a UV sealing member 66 on planar portions surrounding the etching pocket 64, as shown in FIG. 2B. A region surrounded by this UV sealing member 66 corresponds to the panel region.

Next, as shown in FIG. 2C, an element substrate 10 is laminated on the cap glass 60 with a gap maintained between these two layers, while UV radiation is applied under pressure (S5). This lamination is carried out in a dry nitrogen gas ($N_2$) atmosphere so that dry $N_2$ is enclosed in a space surrounded by the UV sealing member 66 (a sealed space). At this point, EL elements are formed on the element substrate 10. More specifically, each organic EL element comprises an anode 12, an emissive element layer 20 having at least an emissive layer, and a cathode 14, which may be accumulated, for example, in that order, on the element substrate 10 made of glass or the like. The organic EL element has a passive matrix configuration in which the anodes 12 and the cathodes 14 are disposed in respective, orthogonal striped patterns with the emissive element layer 20 interposed therein between, or an active matrix pattern in which a thin film transistor or the like is provided for each pixel (not shown), and the anode 12 is individually formed for each pixel whereas the cathode 14 is formed as a common electrode for all the pixels.

While a region corresponding to only a single organic EL panel is shown in FIGS. 2A to 2D, when a plurality of panels are formed from a single large-size substrate, each of the cap substrate 60 and the element substrate 10 includes a plurality of panel regions which are partitioned from each other by a plurality of sealing members 66. Therefore, the cap glass 60 and the element substrate 10 which have been bonded together are cut into individual panels (S6) to thereby form the individual organic EL panels.

More specifically, as shown in FIG. 3A, a plurality of etching pockets 64, each corresponding to one of the individual organic EL panels, are formed in the cap glass (substrate) 60. Further, as shown in FIG. 3B, the thickness of the cap glass 60 is set to approximately 700 μm and the depth of the etching pocket 64 is set to approximately 300 μm.

It is also possible to inject silicon oil rather than enclosing dry $N_2$ in the individual panels. When this is done, as in the case of a liquid crystal display, an injection opening 68 is formed in part of the UV sealing member 66 of an individual organic EL panel as shown in FIG. 2D, and the silicon oil is injected through the injection opening 68 into the interior space of the individual panel which has been cut (S7). After injection of silicon oil, the injection opening 68 is sealed (S8), and the organic EL panel is thus completed.

However, with the above-described configuration in which dry nitrogen is enclosed between the opposing substrate 60 and the element substrate 10, it is difficult to maintain a gap between the substrates in the sealed space where nitrogen only exists, and this may cause the opposing substrate 60 to come in contact with the elements and damage them when the opposing substrate 60 is deformed due to external pressure or the like. These problems are likely to occur as the panel size increases.

When silicon oil is injected, on the other hand, it is necessary to seal the injection opening formed in part of the UV sealing member 66 after injection, which complicates the assembly and manufacturing procedures.

Further, when dry nitrogen is enclosed between the opposing substrate 60 and the element substrate 10 according to the above-described manufacturing method, there is a possibility that an excessive amount of nitrogen gas may be enclosed in the sealed space, for example, due to misalignment in bonding the two substrates. Enclosure of excessive nitrogen would increase the pressure in the sealed space of the panel, leading to a problem that the opposing substrate 60 is likely to be unstuck from the element substrate.

SUMMARY OF THE INVENTION

The present invention is made in view of the foregoing disadvantages and aims to provide a simple manufacturing method capable of securing a sealed space for reliably protecting the organic EL elements or the like between an element substrate and an opposing substrate.

In accordance with one aspect of the present invention, there is provided a method of manufacturing an electroluminescence panel in which an opposing substrate is laminated on an element substrate on which a plurality of electroluminescence elements are formed, to thereby form an electroluminescence panel, the method comprising the steps of forming a sealing member which defines a periphery of one electroluminescence panel region on either one of the element substrate or the opposing substrate, applying a drop of sealing liquid to fill the panel region bounded by the sealing member in a vacuum, and affixing the element substrate and the opposing substrate together with the sealing member.

In accordance with another aspect of the present invention, in the above method, after the element substrate and the opposing substrate are brought into contact with each other via the sealing member in a vacuum, the element substrate and the opposing substrate having the sealing member in between are exposed to atmospheric pressure and then the sealing member is cured.

In accordance with another aspect of the present invention, there is provided a method of manufacturing an electroluminescence panel in which an opposing substrate is laminated on an element substrate on which a plurality of electroluminescence elements are formed, to thereby form an electroluminescence panel, the method comprising the steps of forming a sealing member which defines a periphery of one electroluminescence panel region in a jointless manner on either one of the element substrate or the opposing substrate, applying a drop of sealing liquid to fill the panel region bounded by the sealing member in a vacuum, and adhering the element substrate and the opposing substrate together with the sealing member.

In accordance with a further aspect of the present invention, there is provided an electroluminescence panel comprising an element substrate on which a plurality of electroluminescence elements are formed, and an opposing substrate laminated onto the element substrate, wherein a sealing member for bonding the element substrate and the opposing substrate together defines a periphery of one electroluminescence panel region in a jointless manner, and the panel region which is bounded by the sealing member and sealed is filled with a sealing liquid.

In this manner, in a vacuum, a drop of sealing liquid such as silicon oil is applied onto the panel region and the element substrate and the opposing substrate are adhered together with a sealing member. Therefore, the necessity of forming an injection opening in the sealing member can be eliminated. The sealing member is formed in a jointless manner and therefore requires no sealing operation of the injection opening. Further, because the substrates are bonded together in a vacuum, even when some space is formed between the substrates and the sealing liquid, such a space would disappear when the substrates are returned to a normal atmosphere. Accordingly, an organic EL panel can be manufactured using a very effective lamination operation.

In accordance with another aspect of the present invention, in the above manufacturing method, it is preferable that the sealing member is formed on the opposing substrate and injection of a sealing liquid and affixing of the opposing substrate and the element substrate is performed in a vacuum, with the opposing substrate disposed in substantially the horizontal direction such that the sealing member is located on top of the opposing substrate.

In accordance with a further aspect of the present invention, it is preferable that when a desiccant is provided within a sealed space, the desiccant is fixed to a concave portion formed on the electroluminescence panel region of the opposing substrate and the sealing member is formed on the opposing substrate having the desiccant thus fixed.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENTS

Figure 1:
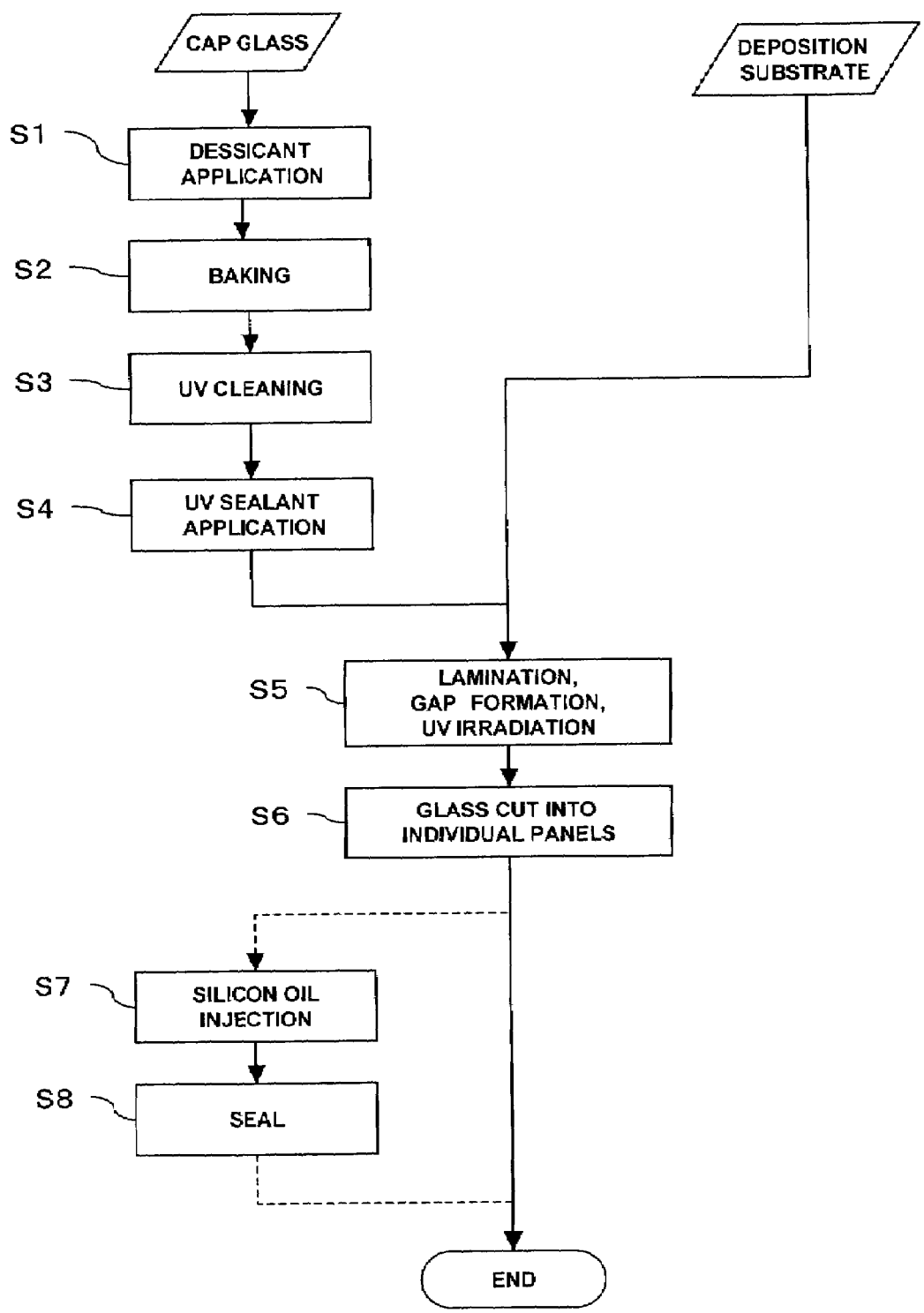
FIG. 1 is a flowchart showing a manufacturing method of a panel according to a related art.
Figure 2A:
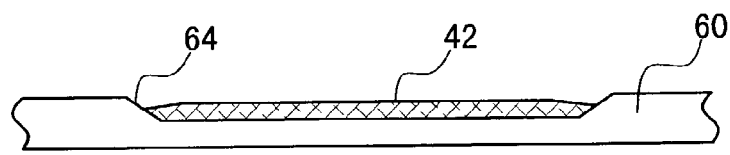
FIGS. 2A, 2B, 2C and 2D show the manufacturing process of a panel according to a related art.
Figure 2B:
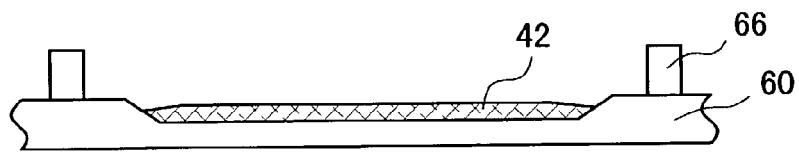
Figure 2C:
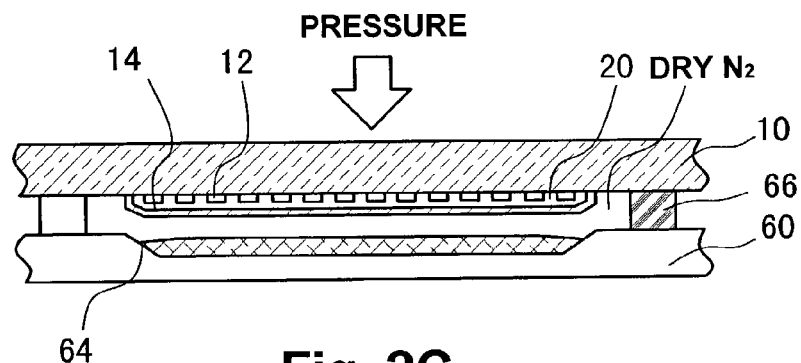
Figure 2D:
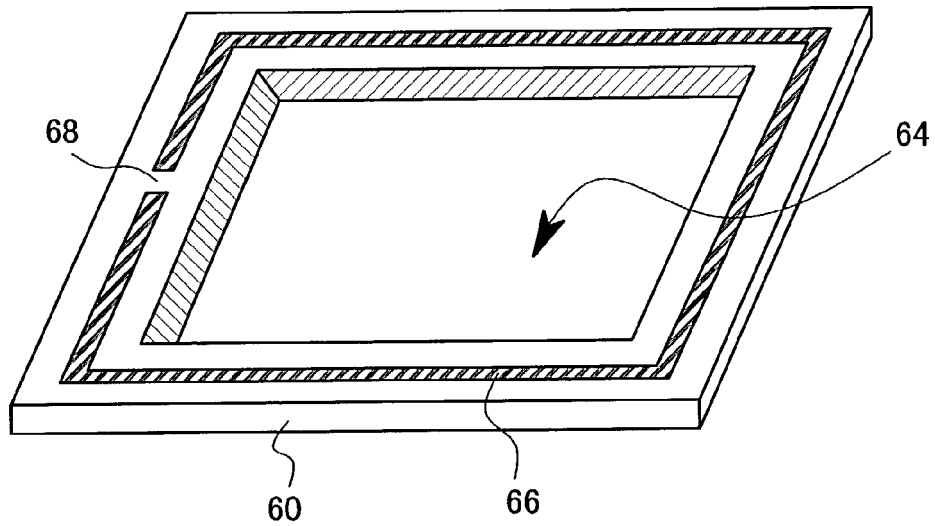
Figure 3A:
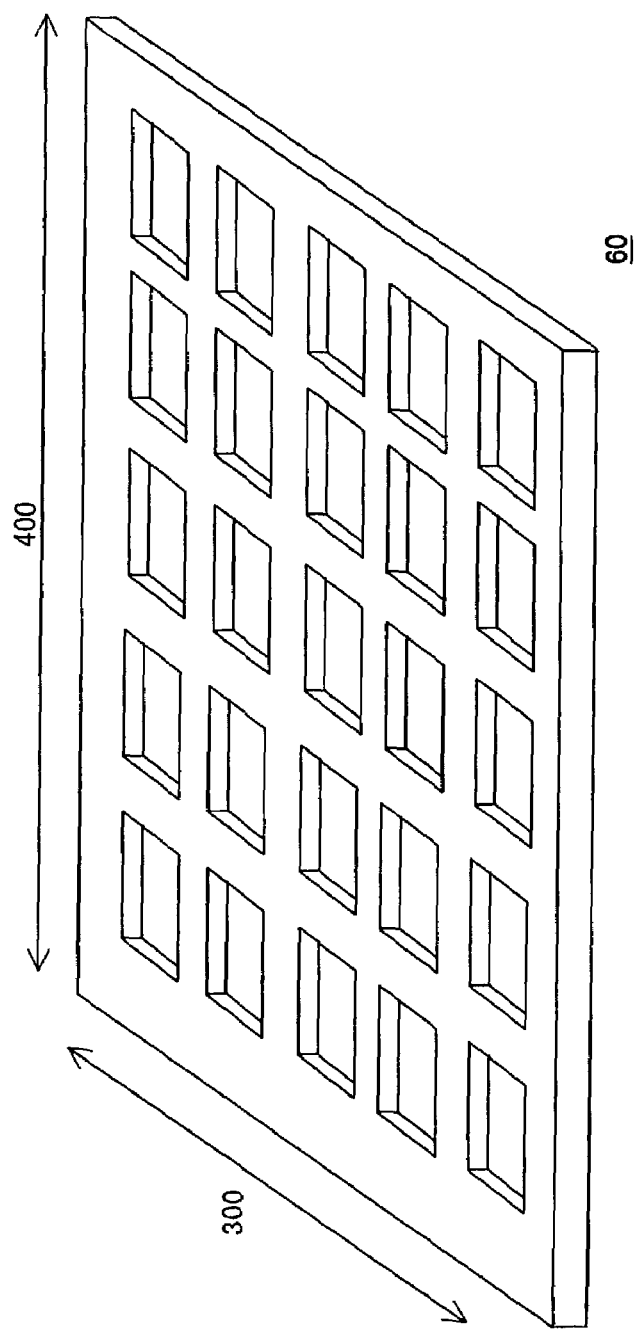
FIGS. 3A and 3B are diagrams showing a substrate configuration according to a related art.
Figure 3B:
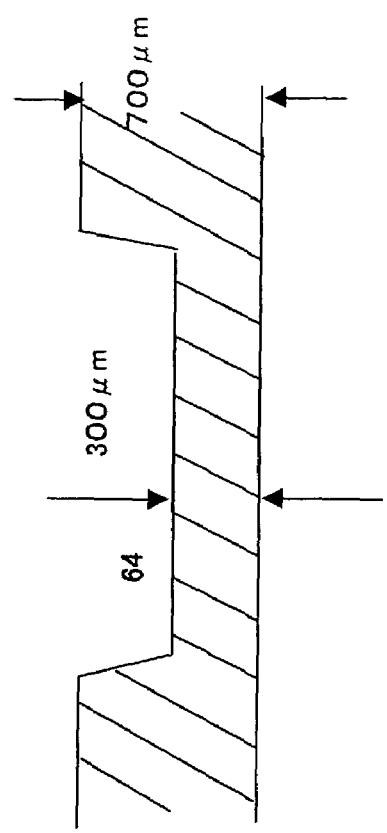
Figure 4:
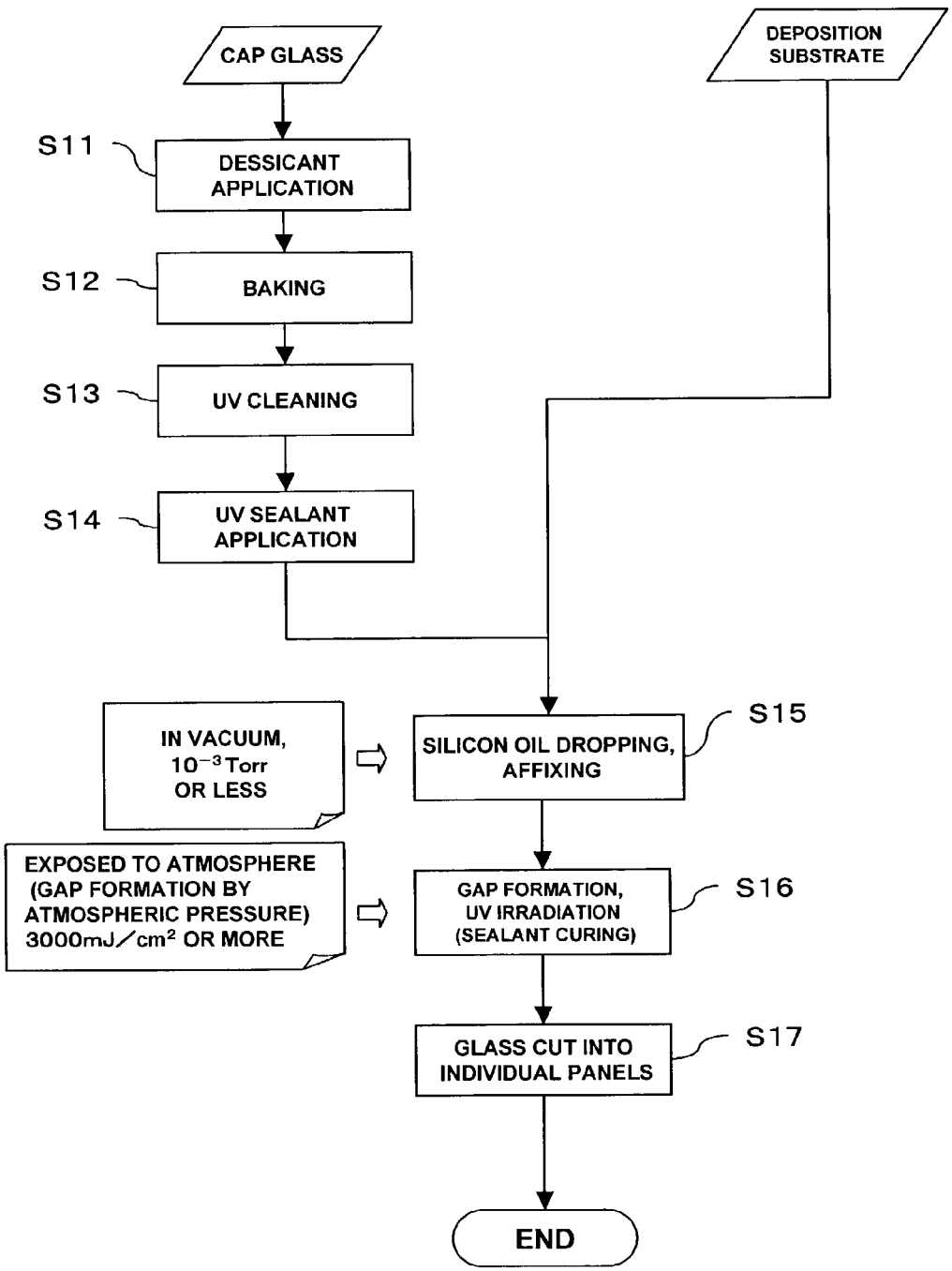
FIG. 4 is a flowchart showing a manufacturing method of a panel according to an embodiment of the present invention.
Figure 5A:
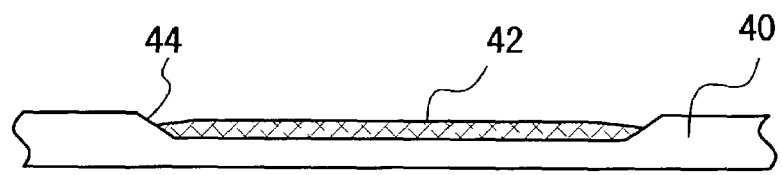
FIGS. 5A, 5B, 5C and 5D show the manufacturing process of a panel according to the embodiment of the present invention.
Figure 5B:
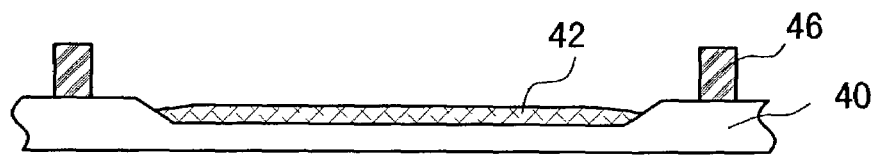

A method of manufacturing an organic EL panel according to an embodiment of the present invention will be described with reference to FIGS. 4, 5A to 5D, 6A, 6B, and 7A to 7C. First, an opposing substrate (cap glass: sealing substrate) 40 is prepared and a paste of a desiccant 42 is applied to the substrate 40 (S11). A desiccant paste is a solvent containing a mixture of Ba oxide, Ca oxide or the like. As shown in FIG. 5A, an etching pocket 44 is formed in the panel region of the cap glass 40 by etching, and the desiccant 42 is applied to this etching pocket 43. Then, the whole product is baked at about 140° C. or more in an oven (S12). As a result, a solvent or the like evaporates from the desiccant 42 and the desiccant 42 is activated. Next, a surface of the substrate 40 is cleaned with UV irradiation having an energy of 10 mW/cm$^2$ or greater. Thereafter, a UV sealing member 46 is applied to the substrate 40 such that it projects from a planar surface of the cap glass 40. More specifically, the UV sealing member 46 is formed on the planar portion of the substrate 40 around the etching pocket 44. The region surrounded by the UV sealing member 46 corresponds to the panel region (a sealed region). The UV sealing member 46 is made of an epoxy UV resin, for example, and has a height of approximately 30 to 50 µm.

Figure 5C:
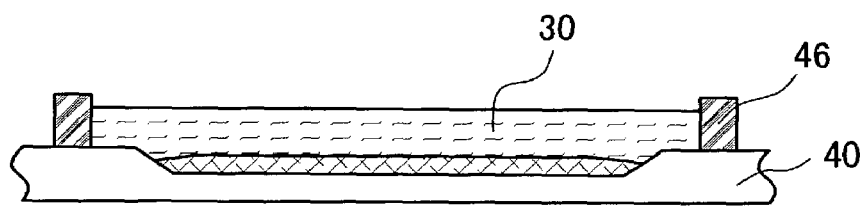
Figure 5D:
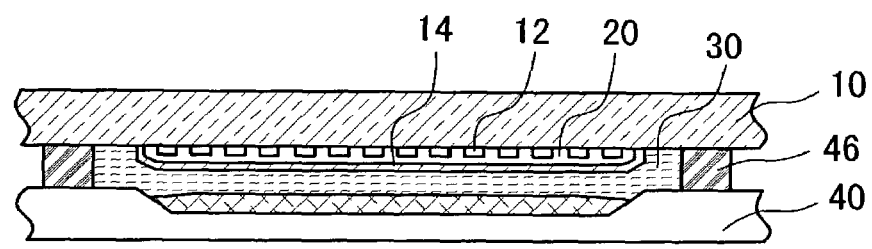

Then, in a vacuum ($10^{-3}$ Torr or less; 1 Torr≈133 Pa), silicon oil 30 is dropped into the panel region enclosed by the UV sealing member 46 as shown in FIG. 5C. Because the cap glass 40 is disposed facing upward, the region enclosed by the UV sealing member 46 can be filled with the silicon oil 30 which is dropped. Thereafter, as shown in FIG. 5D, an element substrate 10 is brought in contact with the cap glass 40 in a vacuum (S15). In this manner, a space between the cap glass whose periphery is enclosed by the UV sealing member 46 and the element substrate 10 is filled with the silicon oil (although some gas may be contained). The element substrate 10 has a passive matrix type or active matrix type configuration which comprises an organic EL element including an anode 12 formed by ITO or the like, an emissive element layer 20 and a cathode 13 formed by Al or the like. The emissive element layer 20 includes, from the anode side, a hole transport layer, an emissive layer, an electron transport layer and an electron injecting layer, for an example.

The two substrates which are thus affixed together (temporarily adhered to each other) are then exposed to the atmosphere. Then, due to a difference between the atmospheric pressure and the decompressed pressure within the sealed space, the element substrate 10 and the opposing substrate 40 are firmly affixed to each other with a gap (GAP) therebetween determined in accordance with the height and elasticity of the sealing member 46, an amount of applied silicon oil, or the like. In this state, the UV sealing member 46 is cured by a UV irradiation having an energy of 300 mJ/cm² or greater.

After the UV sealing member 46 is cured, the cap glass 40 and the element substrate 10 are cut into individual panels (S17) to thereby complete individual organic EL panels.

Figure 6A:
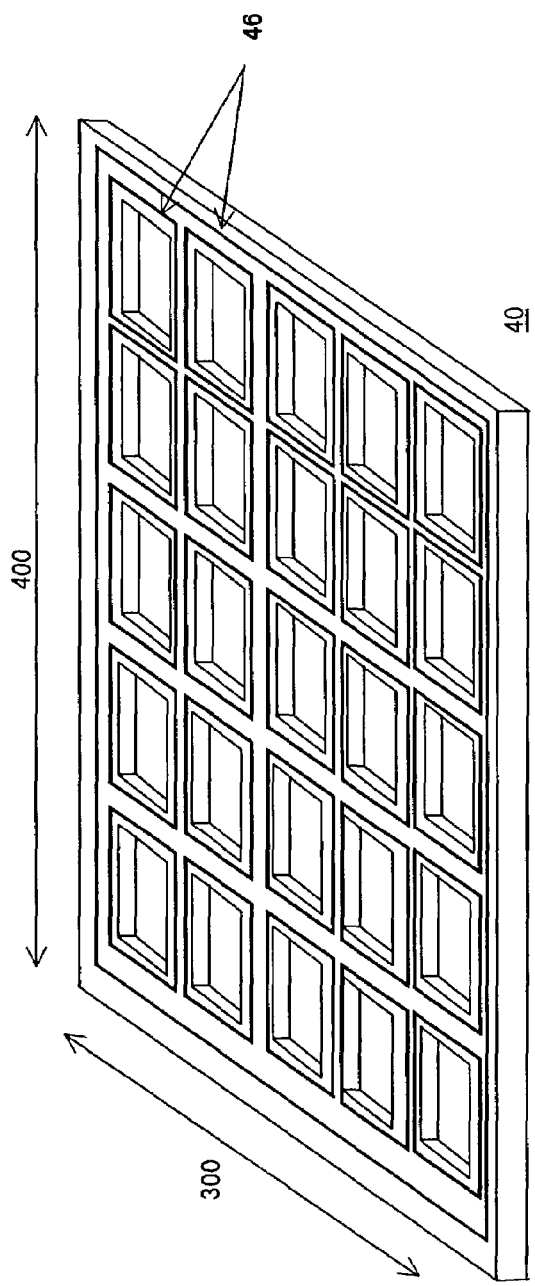
FIGS. 6A and 6B are diagrams showing a substrate configuration according to the embodiment of the present invention.
Figure 6B:
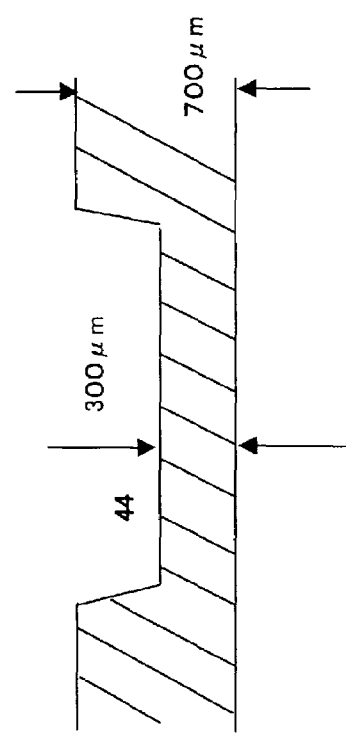

Each of the cap substrate 40 and the element substrate 10 used in this embodiment includes a plurality of panel regions which are partitioned from each other by a plurality of UV sealing members 46, as shown in FIG. 6A. By cutting the substrate along the periphery of each panel, more accurately, between two sealing members disposed between adjacent panel regions, the individual panels can be formed. Further, as shown in FIG. 6B, a plurality of etching pockets 44 each corresponding to one of the individual organic EL panels, are formed on the cap glass (substrate) 40. The thickness of the cap glass 40 is set to approximately 700 μm, and the depth of the etching pocket 44 is set to approximately 300 μm.

As described above, according to the present embodiment, by enclosing the silicon oil 30 to temporarily adhere the element substrate 10 and the cap substrate 40 to each other in a vacuum and then exposing these substrates to the atmospheric pressure, these substrates are firmly adsorbed to each other to automatically thereby determine a gap between them. Therefore, contrary to the conventional method, there is no need to provide an injection opening or the like in the UV sealing member 46 or to seal such an injection opening, and injection of silicon oil into the sealed space can be completed simultaneously with the gap formation (simultaneously with adhering), enabling simple and reliable sealing operation with less variation in the sealed states. Further, because the silicon oil is enclosed in the sealed space, the opposing substrate 40 is reinforced even when the size of a cell (individual EL panel) is increased. Also, because the elements formed on the element substrate 10 are spaced from the opposing substrate 40 by the silicon oil, the possibility of contact between the opposing substrate 40 and these elements can be reduced. Further, according to the present invention, the two substrates are automatically adsorbed with each other because of the difference in pressures when affixing the substrates together (when forming a gap). As a result, it is not necessary to pressurize the substrates, which eliminates one possible cause for breaking of the cap glass during lamination. In addition, because the substrates are affixed together in a vacuum, even when some space is formed between the substrates and the silicon oil 30, such a space will disappear when the substrates are returned to the atmosphere, and the lamination operation can be performed very easily. Of course, even when some gas remains within the sealed space, it is unlikely that such a gas will have any significant affect on the elements, because a slight amount of dry nitrogen or the like remains within the vacuum atmosphere.

Figure 7A:
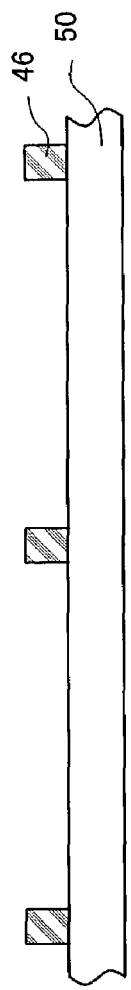
FIGS. 7A, 7B, and 7C show a manufacturing process of a panel according to another embodiment of the present invention.
Figure 7B:
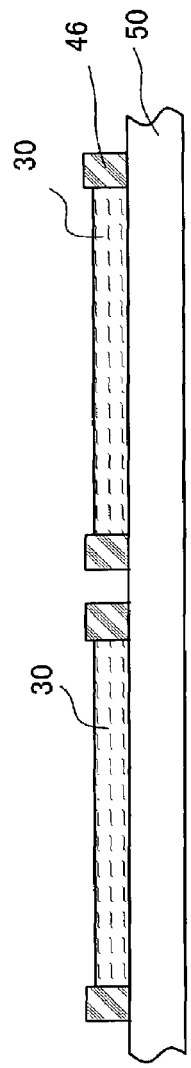
Figure 7C:
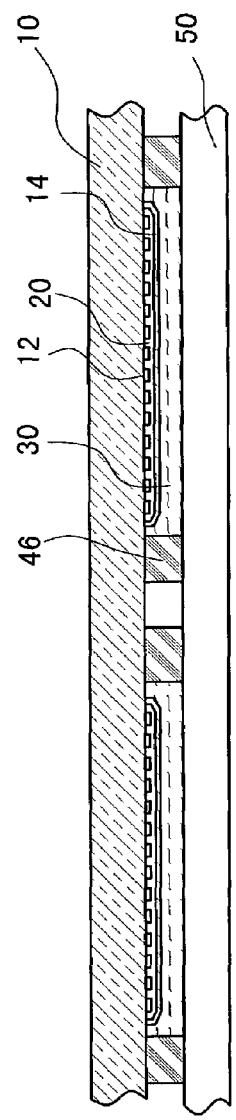

FIGS. 7A to 7C show another embodiment of the present invention. In this example, no desiccant is provided within the sealed space. Namely, an etching pocket is not formed in a cap glass 50 so that a surface of the cap glass 50 remains flat. According to this embodiment, UV sealing members 46 are provided on the planer surface of the cap glass 50 so as to define the panel regions. Then, in a vacuum, silicon oil is injected and the element substrate 10 is laminated to the cap glass 50. The substrates are then exposed to the atmospheric pressure, the UV sealing member 46 is cured by UV irradiation, and the glass is cut into individual panels.

As described above, even when a desiccant is not used, by injecting silicon oil and affixing the substrates together in a vacuum, it is possible to effectively manufacture an EL panel without intrusion of moisture into the sealed space. Further, because the need of forming a pocket 44 into which a desiccant is provided is eliminated, the cap glass 50 can have an even thickness of 700 μm, for example, over the entire surface, so that the cap glass 50 has higher strength than the glass 50 having an etching pocket 44 formed therein.

While silicon oil is enclosed in the sealed space in the above examples, any sealing liquid (fluid) other than silicon oil may be employed as long as it has an insulation property, sufficient chemical stability, moisture-resistant property, and a relatively high boiling point.

As described above, because with the present invention silicon oil is enclosed and the substrates are affixed together in a vacuum, there is no need to form an injection opening or the like in the sealing member, which further eliminates the need for sealing of the injection opening. Further, because the substrates are affixed in a vacuum, even when some space is formed between the substrates and the silicon oil 30, the space will disappear when the substrates are returned to a normal atmosphere. It is therefore possible to manufacture an organic EL panel using a very effective lamination operation.

While the preferred embodiments of the present invention have been described using specific terms, such description is for illustrative purposes only, and it is to be understood that changes and variations may be made without departing from the spirit or scope of the appended claims.

What is claimed is:

1. A method of manufacturing an electroluminescence panel in which an opposing substrate is laminated on an element substrate on which a plurality of electroluminescence elements are formed, to thereby form an electroluminescence panel, the method comprising the steps of:
    forming a sealing member which defines a periphery of one electroluminescence panel region on either one of the element substrate or the opposing substrate;
    applying a drop of sealing liquid to fill the panel region bounded by the sealing member in a vacuum;
    adhering the element substrate and the opposing substrate together with the sealing member after applying the drop of sealing liquid; and
    wherein, after the element substrate and the opposing substrate are brought into contact with each other via the sealing member in a vacuum, the element substrate and the opposing substrate having the sealing member in between are exposed to atmospheric pressure and then the sealing member is cured.

2. A method according to claim 1, wherein the sealing member is formed on the opposing substrate and application of the sealing liquid and affixing of the opposing substrate and the element substrate is performed in a vacuum, with the opposing substrate disposed in substantially the horizontal direction such that the sealing member is located on top of the opposing substrate.

3. A method according to claim 1, wherein the sealing member is formed on the opposing substrate and application of the sealing liquid and affixing of the opposing substrate and the element substrate is performed in a vacuum, with the opposing substrate disposed in substantially the horizontal direction such that the sealing member is located on top of the opposing substrate.

4. A method according to claim 1, wherein the opposing substrate includes a concave portion formed in the electroluminescence panel region, a desiccant is fixed in this concave portion, and the sealing member is formed on the opposing substrate in which the desiccant is fixed.

5. A method according to claim 1, wherein forming the sealing member which defines the periphery of one electroluminescence panel region is in a jointless manner on either one of the element substrate or the opposing substrate.

6. A method according to claim 5, wherein the sealing member is formed on the opposing substrate and application of the sealing liquid and affixing of the opposing substrate and the element substrate is performed in a vacuum, with the opposing substrate disposed in substantially the horizontal direction such that the sealing member is located on top of the opposing substrate.

7. A method according to claim 5, wherein the sealing member is formed on the opposing substrate and application of the sealing liquid and affixing of the opposing substrate and the element substrate is performed in a vacuum, with the opposing substrate disposed in substantially the horizontal direction such that the sealing member is located on top of the opposing substrate.

8. A method according to claim 5, wherein the opposing substrate includes a concave portion formed in the electroluminescence panel region, a desiccant is fixed in this concave portion, and the sealing member is formed on the opposing substrate in which the desiccant is fixed.

9. A method according to claim 1, wherein a degree of vacuum during application of the drop of the sealing liquid is $10^{-3}$ or less.

* * * * *